(12) United States Patent
Roberts

(10) Patent No.: US 10,984,972 B2
(45) Date of Patent: Apr. 20, 2021

(54) METHOD AND APPARATUS FOR A PRINTED CIRCUIT BOARD

(71) Applicant: GE Aviation Systems Limited, Cheltenham (GB)

(72) Inventor: David Killin Roberts, Pershore (GB)

(73) Assignee: GE Aviation Systems Limited, Cheltenham (GB)

(*) Notice: Subject to any disclaimer, the term of this patent is extended or adjusted under 35 U.S.C. 154(b) by 426 days.

(21) Appl. No.: 15/916,526

(22) Filed: Mar. 9, 2018

(65) Prior Publication Data
US 2018/0294117 A1    Oct. 11, 2018

(30) Foreign Application Priority Data
Apr. 6, 2017 (GB) ...................... 1705568

(51) Int. Cl.
| | | |
|---|---|---|
| *H05K 1/02* | (2006.01) | |
| *H01H 33/76* | (2006.01) | |
| *H02H 1/00* | (2006.01) | |
| *H01H 9/30* | (2006.01) | |
| *H02H 9/02* | (2006.01) | |
| *H01H 85/38* | (2006.01) | |

(52) U.S. Cl.
CPC .......... *H01H 33/76* (2013.01); *H02H 1/0015* (2013.01); *H05K 1/0254* (2013.01); *H01H 9/302* (2013.01); *H01H 85/38* (2013.01); *H02H 9/02* (2013.01); *H05K 1/02* (2013.01); *H05K 1/0201* (2013.01); *H05K 2203/049* (2013.01)

(58) Field of Classification Search
USPC ................................................ 361/212, 220
See application file for complete search history.

(56) References Cited

U.S. PATENT DOCUMENTS

| | | | |
|---|---|---|---|
| 4,082,866 A | 4/1978 | Link | |
| 6,515,283 B1 | 2/2003 | Castleman et al. | |
| 6,518,574 B1 | 2/2003 | Castleman | |
| 9,865,537 B1 * | 1/2018 | Male .................. | H01L 23/5256 |
| 2015/0137685 A1 * | 5/2015 | De Santiago ........ | H05B 3/0047 315/127 |

* cited by examiner

*Primary Examiner* — Danny Nguyen
(74) *Attorney, Agent, or Firm* — McGarry Bair PC

(57) ABSTRACT

A method and apparatus for a printed circuit board having a substrate, an electrical component disposed on the substrate and connected to an input, a wire bond connecting the electrical component to an output, and a gas-generating fuel disposed on the substrate proximate to the wire bond to account for an arc fault.

19 Claims, 5 Drawing Sheets

METHOD AND APPARATUS FOR A PRINTED CIRCUIT BOARD

CROSS REFERENCE TO RELATED APPLICATION(S)

This application claims priority to and benefit of pending Great Britain Patent Application No. 1705568, filed Apr. 6, 2017, which is incorporated herein in its entirety.

BACKGROUND OF THE INVENTION

Electrical systems employ electrical connections between an input and output for delivering power or electrical signals from a source to a destination. In one example, the electrical connections can include wire bonding between an electrical component, such as a power controller, integrated circuit, or the like, to an electrical conduit of a printed circuit board, such as a trace. In the event of an electrical arc fault or other failure condition, high currents might be transmitted through a normally nonconductive medium, such as air, with unexpected consequences for the electrical system at or about the arcing failure point.

BRIEF DESCRIPTION OF THE INVENTION

In one aspect, the present disclosure relates to a printed circuit board including a substrate, an electrical component disposed on the substrate, a wire bond connected with the electrical component, and a gas-generating fuel disposed on the substrate proximate to the wire bond and operably activatable such that activation of the gas-generating fuel generates a jet of gas toward the wire bond.

In another aspect, the present disclosure relates to a method of assembling a printed circuit board, including disposing a gas-generating fuel on the substrate proximate to at least one wire bond, wherein the gas-generating fuel is operably activatable such that activation of the gas-generating fuel generates a jet of gas toward the at least one wire bond.

In yet another aspect, the present disclosure relates to a method of extinguishing an arc fault of a wire bond, including activating a gas-generating fuel disposed on a substrate, wherein the activation of the gas-generating fuel generates a jet of gas toward the wire bond configured to disrupt the arc fault.

DESCRIPTION OF EMBODIMENTS OF THE INVENTION

Figure 1:
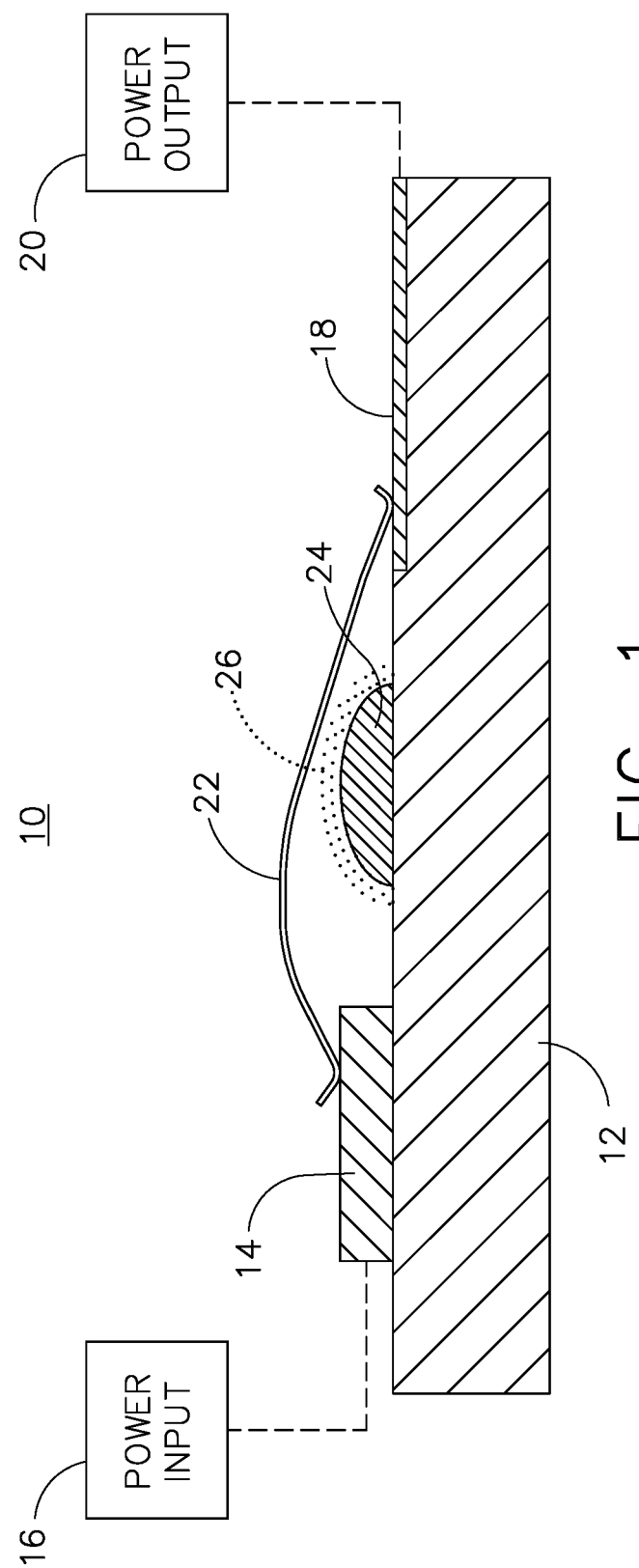
FIG. 1 is a schematic cross section of a printed circuit board, in accordance with various aspects described herein.

The described aspects of the present invention are directed to a method and apparatus associated with detecting, disrupting, interrupting, extinguishing, or otherwise ceasing an electrical fault or an unintended current transmission in a conductor, including but not limited to, a conductive pathway of a printed circuit board, or the printed circuit board itself. In one non-limiting example, the conductive pathway of the printed circuit board can include a wire bond. A non-limiting example environment where such a method and apparatus can be used includes, but is not limited to, a power distribution system, including a power distribution network, and power distribution units. In yet another non-limiting example environment where such a method and apparatus can be used includes solid state power switches or solid state power controllers (SSPCs).

While this description is primarily directed toward a power distribution system including a circuit board, it is also applicable to any environment using a conductor spaced from a substrate, wherein an electrical fault can occur that results in the grounding of the conductor, or an unintended current transmission between the conductor and the grounded current pathway. For example, aspects of the disclosure described herein are equally applicable to circuit breakers, relays, or related configurations having high power levels (on the order of hundreds of volts), such as power supplies or motor controllers. Yet another non-limiting example environment where such a method and apparatus can be used includes, but is not limited to, any electrical transmission system, such as a data transmission conductor or network.

While "a set of" various elements will be described, it will be understood that "a set" can include any number of the respective elements, including only one element. Additionally, while current or voltage values are described as "sensing" or "measuring" the respective electrical current and voltage characteristics, it is understood that sensing or measuring can include a determination of a value indicative, related to, or representative of the electrical current or voltage characteristics, and not the actual current or voltage values.

Also as used herein, the terms "exceeds" or "satisfies" regarding a threshold value is used to mean that the respective value or values satisfy the predetermined threshold, such as being equal to or less than the threshold value, or being within the threshold value range. For example, if a sensed value falls below a minimum threshold, the value can "exceed" the threshold. It will be understood that such a determination may easily be altered to be satisfied by a positive/negative comparison, exceeding comparison, or a true/false comparison.

Connection references (e.g., attached, coupled, connected, and joined) are to be construed broadly and can include intermediate members between a collection of elements and relative movement between elements unless otherwise indicated. As such, connection references do not necessarily infer that two elements are directly connected and in fixed relation to each other. The exemplary drawings are for purposes of illustration only and the dimensions, positions, order and relative sizes reflected in the drawings attached hereto can vary.

Electrical arcs, or arc faults, can occur in an environment where, for example, physical defects in an electrical connection cause a permanent or temporary loss in transmission capabilities. Where a physical separation occurs, the voltage difference between each of the separated terminals in addition to a short distance of separation, can allow for an electrical arc to strike between the terminals by way of a non-conductive medium, such as air. The electrical system can see the electrical arcing event as a sudden or short current reduction, caused by the voltage drop across the separation. In an environment with vibrations, for instance, as in a moving aircraft, a physical defect in an electrical connection might result in intermittent arcing events as the vibrations disconnect and reconnect the electrical connection at the point of the physical defect. In another example embodiments, an electrical arc might be caused by, or relate to a loose terminal connection, or a drawn series fault.

Arc faults can be sustained over a period of time by superheating air between the opposing terminals, generating a superheated plasma. In instances wherein the plasma includes a sufficient number of highly charged particles, the plasma can be electrically conductive, providing a conductive pathway for continued current flow in the form of the arc.

A printed circuit board 10 in accordance with various aspects of the disclosure is illustrated in FIG. 1. The printed circuit board 10 can include a substrate 12 supporting an electrical component 14, for example, connected to an electrical input or source, such as a power input 16. The printed circuit board 10 can also include an electrical conductive pathway downstream of the electrical component 14, such as an electrical trace 18, further connected with an electrical output or electrical destination, such as a power output 20. The electrical component 14 can be conductively connected with the downstream trace 18 by way of a wire bond 22.

In one non-limiting aspect of the disclosure, the printed circuit board 10 can be included as part of a power distribution system. In one non-limiting aspect of the disclosure, the electrical component 14 can act as a switching device to selectively enable or disable transmission of a power supply from the power input 16 to the power output 20. In this sense, the power input can include an alternating current (AC) or direct current (DC) power source. In another non-limiting aspect of the disclosure, the electrical component 14 can include a selectively operable power distribution switch, such as an SSPC.

One non-limiting example of the SSPC can include a silicon carbide (SiC) or Gallium Nitride (GaN) based, high power switch. SiC or GaN can be selected based on their solid state material construction, their ability to handle high voltages and large power levels in smaller and lighter form factors, and their high speed switching ability to perform electrical operations very quickly. Additional switching devices or additional silicon-based power switches can be included.

While aspects of FIG. 1 are described with reference to a power distribution printed circuit board 10, any electrical transmissions, including, but not limited to analog or digital data or signal transmissions, can be included in aspects of the disclosure.

The printed circuit board 10 can also include a gas-generating fuel 24 or fuel mixture disposed on the substrate 12 proximate to the wire bond 22. The gas-generating fuel 24 can include a predetermined or preselected material configured to generate a jet of gas discharged from the fuel 24 during activation. As used herein, a "jet of gas" can include, but is not limited to, a rapid expansion of gas or gases relative to the disposition of the gas-generating fuel 24 in response to some triggering activity for the fuel 24. For instance, a "jet of gas" can include a pulse, a blast, or a propagation of a high-pressure gradient of gas or gases, relative to the expected operating environment of the printed circuit board 10. In this sense, the jet of gas can rapidly accelerate away from the substrate 12. As used herein the gas-generating fuel 24 can be positioned or disposed "proximate" to the wire bond 22, such that, for example, the jet of gas is directed toward the wire bond 22. In this sense, the gas-generating fuel 24 can be disposed directly beneath, to the side of, offset from, or a combination thereof, relative to the wire bond 22, so long as the jet of gas is at least partially directed to the wire bond 22.

Aspects of the disclosure can be included wherein the gas-generating fuel 24 can generate the jet of gas by way of a decomposition or oxidization of chemical compounds, a combustion of the fuel 24, or another reaction wherein the fuel 24 is consumed in order to generate the jet of gas, as described herein. In one non-limiting aspect of the disclosure, the gas-generating fuel 24 can include a solid material. In another non-limiting aspect of the disclosure, the gas-generating fuel 24 can include at least one of an oxidizer or a Nitrogen-rich fuel. In yet another non-limiting aspect of the disclosure, the gas-generating fuel 24 can be selected or configured to generate or produce at least one of an inert or non-toxic gas, such as Nitrogen ($N_2$). In yet another non-limiting aspect, the deposit of gas-generating fuel 24 can be equal to or less than one gram of materials, or enough fuel 24 to generate approximately a quarter liter of gas.

The generating of the jet of gas from the gas-generating fuel 24 can be triggered, initiated, ignited, operably activated, or the like, by a predetermined process or characteristic. For instance, in one non-limiting aspect, the gas-generating fuel 24 can be operably activated in response to a threshold receiving of heat, such as by way of convection, radiation, or conduction. The threshold receiving of heat can be configured or selected based on environmental conditions or proximity to the source of heat. In another non-limiting aspect, the gas-generating fuel 24 can be operably activated in response to controllable stimulation, such as by way of receiving a controllable signal from a processor or controller module.

As shown in dotted line, aspects of the disclosure can be included wherein the gas-generating fuel 24 can be enveloped, covered, sealed, or protected from exposure to the environment by an optional sealing cover 26 or sealant. For instance, the sealing cover 26 can be utilized to prevent loss or degradation of the gas-generating fuel 24 due to effects of exposure to the environment or atmosphere. Aspects of the optional sealing cover 26 can be included wherein the sealing cover 26 is a material that does not inhibit, or may even be configured to promote or enhance, the operable activation the operable activation of the gas-generating fuel 24. In yet another non-limiting aspect, the sealing cover 26 can be selected or configured to be consumed during the operable activation of the gas-generating fuel 24 or the generating of the jet of gas, or may be projected in the direction of the jet of gas.

Figure 2:
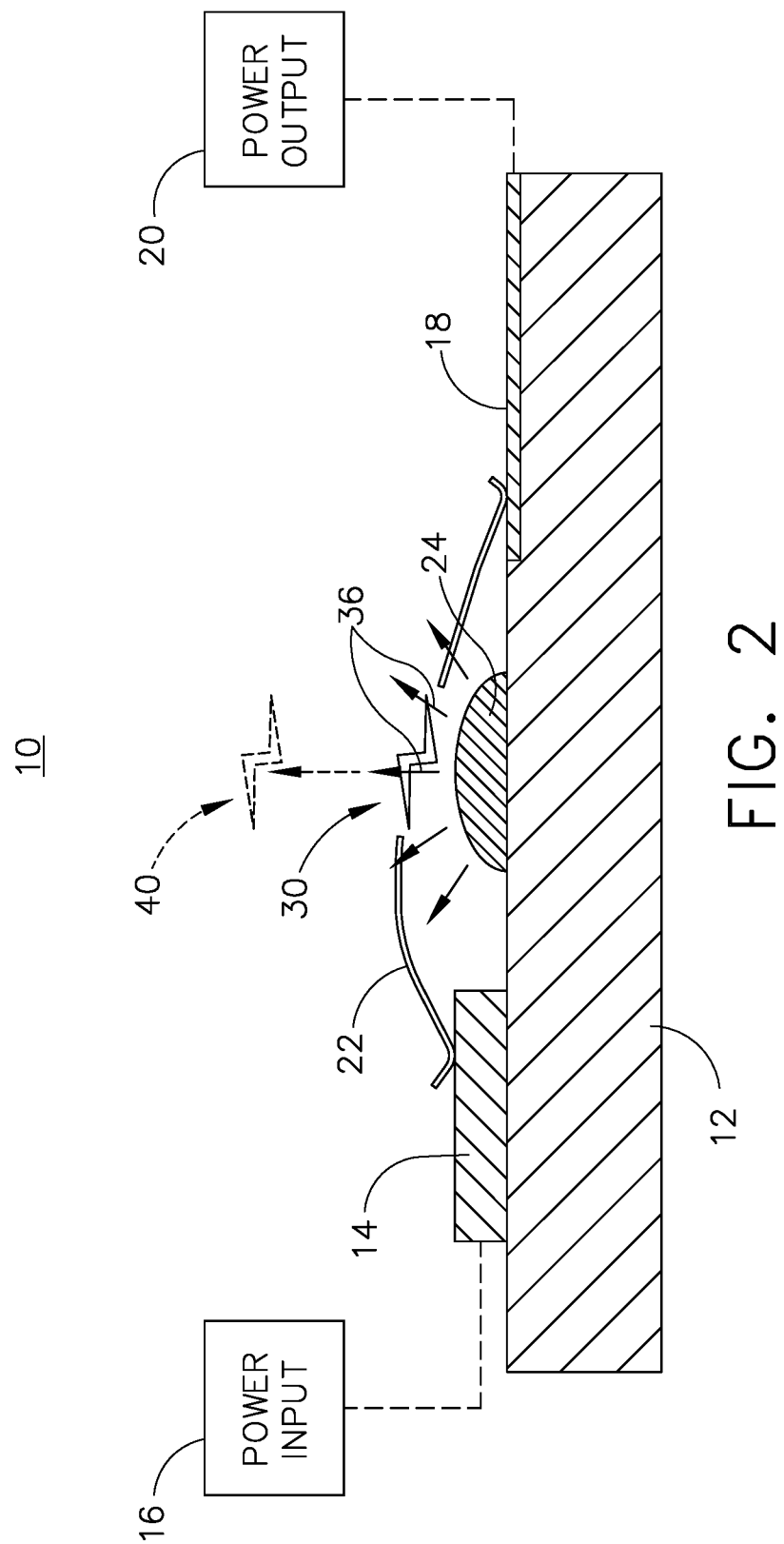
FIG. 2 is a schematic cross section of the printed circuit board of FIG. 1 having an arc fault in a wire bond, in accordance with various aspects described herein.

Turning now to FIG. 2, a non-limiting example of the printed circuit board 10 is illustrated wherein an arc fault 30 has developed across opposing disconnected, broken, damaged, or the like, terminals of the wire bond 22. Aspects of the disclosure can be included wherein the operable activation of the gas-generating fuel 24 is based on the presence, detection, or determination that an arc fault 30 is, has, or is likely to occur on the wire bond 22. In response to the presence, detection, or determination that an arc fault 30 occurs, the gas-generating fuel 24 can be operably activated such that the activation of the gas-generating fuel 24 generates a jet of gas (illustrated as radial arrows 36) toward the wire bond 22 or the arc fault 30. In the illustrated example shown, the jet of gas 36 are seen effectively expanding in all directions away from the substantially planar substrate 12 surface, with at least a subset of the jets directing toward the wire bond 22 or arc fault 30.

The expansion of the jet of gas 36 away from the substrate 12 or the gas-generating fuel 24 can effect a pulse, blast, or pressure-based "push" away from the substrate 12. The pulse can, in turn, disrupt the arc fault 30 by effecting a movement of the arc fault 30 or arc plasma away from the opposing wire bond 22 terminals. The movement of the arc fault or arc plasma away from the wire bond 22 is illustrated in dotted outline 40. The effected movement due to the jet of gas 36 can operably disrupt, or operably or effectively extinguish an otherwise self-sustaining arc fault 30.

In one non-limiting aspect of the disclosure illustrated, the gas-generating fuel 24 can be operably activated by way of heat generated by the arc fault 30, and the proximity of the arc fault 30 to the gas-generating fuel 24. In another non-limiting aspect of the disclosure, at least one of the power input 16, the electrical component 14, or another connected system can operably shut down, turn off, or stop the electrical circuit connected with the wire bond 22 in addition to the operable activation of the gas-generating fuel 24, to further ensure another or a new arc fault 30 does not reoccur. Aspects of the gas-generating fuel 24 can be included wherein all or a substantial portion of the fuel 24 is consumed in the activation, effecting a single-use arc fault 30 disruption or extinguishing. In another aspect, the gas-generating fuel 24 can be partially consumed as needed, such as in response to heat from the arc fault 30, such that the gas-generating fuel 24 can include subsequent activations to disrupt or extinguish sequentially occurring or reoccurring arc faults 30.

Figure 3:
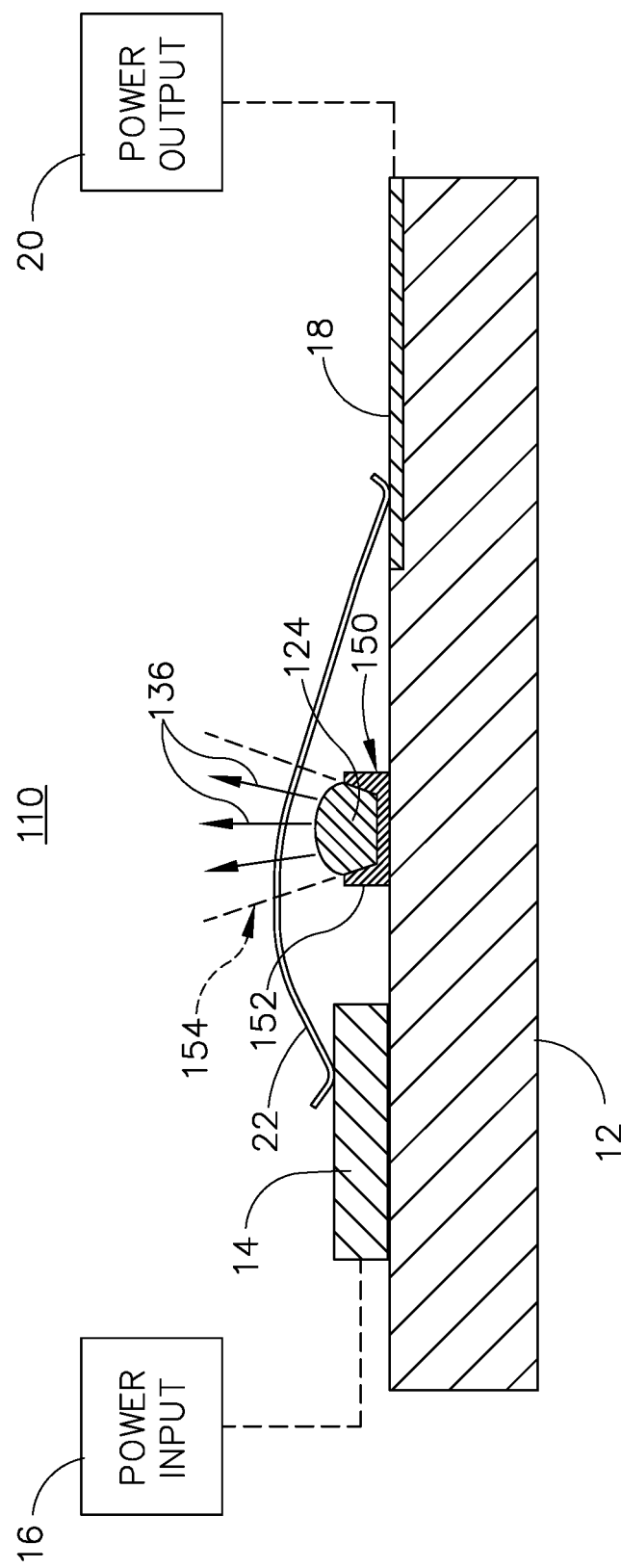
FIG. 3 is a schematic cross section of another printed circuit board having a casing, in accordance with various aspects described herein.

FIG. 3 illustrates a printed circuit board 110 according to another aspect of the present disclosure. The printed circuit board 110 is similar to the printed circuit board 10; therefore, like parts will be identified with like numerals increased by 100, with it being understood that the description of the like parts of the printed circuit board 10 applies to the printed circuit board 110, unless otherwise noted. For ease of understanding, FIG. 3 does not illustrate the arc fault 30 of the printed circuit board 10, but operates to disrupt or extinguish the arc fault 30, as described herein.

One difference is that the printed circuit board 110 can include a casing 150 disposed on the substrate 12, proximate to the wire bond 22, and configured to hold, receive, or contain the gas-generating fuel 124. The casing 150 can also include at least one side wall 152. Aspects of the casing 150 or the at least one side wall 152 can be configured or selected such that the casing 150, the at least one side wall 152, or a combination thereof is configured to manage or direct the jet of gas 136 in at least a partially limited direction, aperture, or selectively bounded volume, illustrated in dotted line 154. In one non-limiting aspect, the bounded volume 154 can be further selected to ensure directing of the jet of gas 124 toward the wire bond 22, arc fault 30, or the like.

While shown in a schematic cross-sectional view (i.e. two dimensional), aspects of the disclosure can be included wherein the casing 150, the side wills 152, or the gas-generating fuel 124 can be offset from the wire bond 22, such as horizontally spaced such that the wire bond 22 is not directly above the gas-generating fuel 124. In this example, at least one of the casing 150 or side walls 152 can be shaped, angled, configured, or aligned to direct the bounded volume 154 of the jet of gas 136 at least partially horizontally to reach, match, or interact with the wire bond 22 or the arc fault 30.

Figure 4:
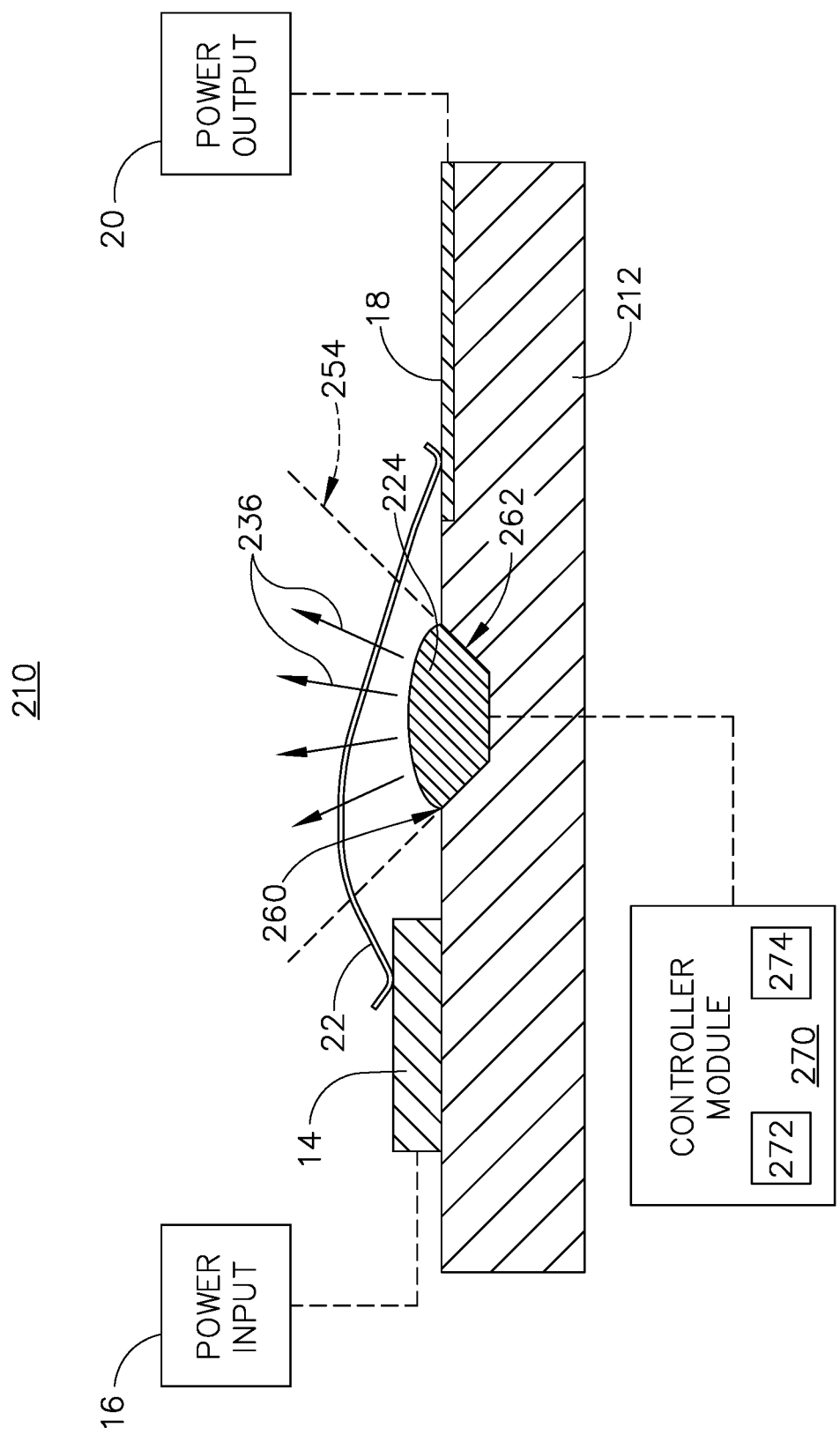
FIG. 4 is a schematic cross section of yet another printed circuit board having a depression, in accordance with various aspects described herein.

FIG. 4 illustrates a printed circuit board 210 according to another aspect of the present disclosure. The printed circuit board 210 is similar to the printed circuit board 10, 110; therefore, like parts will be identified with like numerals increased by 200, with it being understood that the description of the like parts of the printed circuit board 10, 110 applies to the printed circuit board 210, unless otherwise noted. For ease of understanding, FIG. 4 also does not illustrate the arc fault 30 of the printed circuit board 10, 110, but operates to disrupt or extinguish the arc fault 30, as described herein.

One difference is that the printed circuit board 210 can include a substrate 212 having a concave, a depressed portion, a well, or a depression 260 configured to receive the deposit of the gas-generating fuel 224. The depression 260 can be defined by at least one side walls 262 of the depression 260, or by walls 262 of the substrate 212. Aspects of the disclosure can be included wherein the depression 260 can be positioned proximate to the wire bond 22, as described herein.

Aspects of the depression 260 or the at least one side wall 262 can be configured or selected such that the depression 260, the at least one side wall 262, or a combination thereof is configured to manage or direct the jet of gas 236 in at least a partially limited direction, aperture, or selectively bounded volume, illustrated in dotted line 254. In one non-limiting aspect, the bounded volume 254 can be further selected to ensure directing of the jet of gas 224 toward the wire bond 22, arc fault 30, or the like.

While shown in a schematic cross-sectional view (i.e. two dimensional), aspects of the disclosure can be included wherein the depression 260, the side wills 262, or the gas-generating fuel 224 can be offset from the wire bond 22, such as horizontally spaced such that the wire bond 22 is not directly above the gas-generating fuel 224. In this example, at least one of the depression 260 or side walls 262 can be shaped, angled, configured, or aligned to direct the bounded volume 254 of the jet of gas 236 at least partially horizontally to reach, match, or interact with the wire bond 22 or the arc fault 30.

Another difference of the printed circuit board 210 is that the printed circuit board can include a controller module 270. The controller module 270 can also include a processor 272 and memory 274. At least one of the controller module 270 or the processor 272 can operate as an arc fault detector system for detecting the occurrence or presences of an arc fault 30. In this sense the controller module 270 or processor 272 can include, or be communicatively coupled with a sensor configured to detect an arc fault 30. In non-limiting examples, the sensor can include at least one of a current sensor or a voltage sensor capable of sensing or measuring the electrical current characteristics of current flowing through the power input 16, the electrical component 14, the trace 18, the power output 20, or a combination thereof. The controller module 270 or the processor 272 can further be connected with the gas-generating fuel 224 by way of a transmissive pathway, illustrated as dotted line 276.

Example current characteristics measurable include, but are not limited to, instantaneous current, average current, or rate of change in current. Likewise, example voltage characteristics measurable include, but are not limited to, instantaneous voltage, average voltage, of rate of change in voltage. While the current sensor and voltage sensor are described as measuring the respective current and voltage characteristics, other measurement locations or characteristics are envisioned. Aspects of the disclosure can include the current and voltage sensors providing the respective sensed current or voltage characteristic to the processor 272 or the controller module 270.

While the current or voltage sensors are described as "sensing" or "measuring" the respective electrical current and voltage characteristics, it is envisioned that sensing or measuring can include a determination of a value indicative, related to, or representative of the electrical current or voltage characteristics, and not the actual current or voltage values. It is also envisioned that the current or voltage sensors can provide respective current or voltage characteristics, as described above, and the processor 272 or the controller module 270 can perform processing on the characteristics. Additionally, an alternative configuration is envisioned wherein the current and voltage sensors are integrated with the processor 272 or controller module 270. In yet another alternative configuration, the processor 272 or controller module 270 can be located remote from the printed circuit board 210, and can be communicatively coupled with the printed circuit board 210 or the gas-generating fuel 224.

The controller module 270 or the processor 272 operates by determining whether a suspected electrical fault, such as an arc fault, is occurring or has occurred. In one non-limiting aspect of the disclosure, the controller module 270 or processor 272 can be configured to execute software or instructions stored in memory 274 and configured or operably to determine whether an arc fault is occurring or has occurred. In another non-limiting aspect, the controller module 270 or the processor 272 can determine whether an arc fault is occurring or has occurred by comparing a sensed or measured electrical value against a threshold value or threshold value range, and determine whether the sensed or measured electrical value exceeds or satisfies the respective threshold. Exceeding or satisfying the respective threshold can be indicative that an arc fault is occurring or has occurred.

Regardless of how the controller module 270 or the processor 272 determines an arc fault 30 is occurring or has occurred, the controller module 270 or the processor can respond with providing a control signal or a controllable signal, by way of the transmissive pathway, to the gas-generating fuel 224. The control or controllable signal can be configured to activate the gas-generating fuel 224 to disrupt or extinguish the arc fault 30, as described herein. In another non-limiting aspect of the disclosure, the processor 272 or controller module 270 can indicate the arc fault event by permanently or temporarily disabling at least a portion of the printed circuit board 210, or reducing the power delivered by the printed circuit board 210 or power input 16 to reduce the impact of any continued arcing event.

Figure 5:
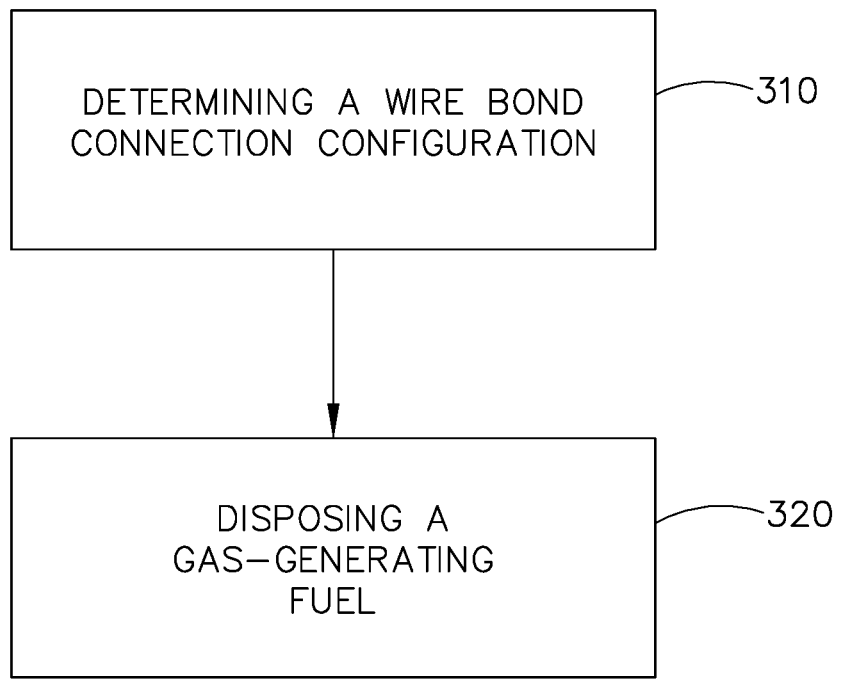
FIG. 5 is an example a flow chart diagram of demonstrating a method of assembling the printed circuit boards of FIGS. 1-4, in accordance with various aspects described herein.

FIG. 5 illustrates a flow chart demonstrating a method 300 of assembling a printed circuit board 10, 110, 210, as described herein. The method 300 begins by determining a wire bond 22 connection configuration for a substrate 12, 212 for disposing at least one wire bond 22 to connect an electrical input 16 to an electrical output 20, at 310. Next, the method 300 operates by disposing a gas-generating fuel 24, 124, 224 on the substrate 12, 212 proximate to the determined at least one wire bond 22, at 320. Aspects of the disclosure can be included wherein, for instance, the method 300 also includes disposing the at least one wire bond 22 proximate the gas-generating fuel 24, 124, 224. In another non-limiting aspect of the disclosure, the disposing the gas-generating fuel 24, 124, 224 at 320 can further includes disposing the gas-generating fuel 24, 124, 224 on the substrate 12, 212 intersecting the determined at least one wire bond 22. The gas-generating fuel 24, 124, 224 is operably activatable such that activation of the gas-generating fuel 24, 124, 224 generates a jet of gas 36, 136, 236 toward the at least one wire bond 22.

Figure 6:
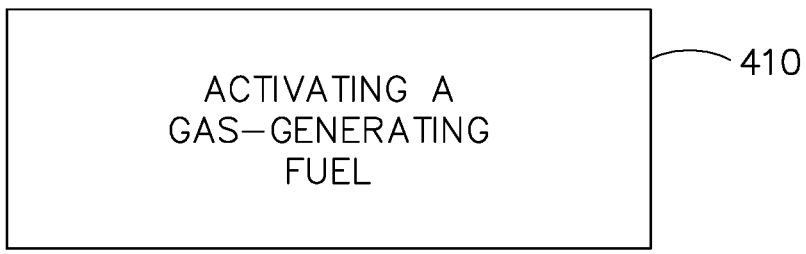
FIG. 6 is an example a flow chart diagram of demonstrating a method of extinguishing an arc fault of a wire bond at the printed circuit boards of FIGS. 1-4, in accordance with various aspects described herein.

FIG. 6 illustrates a flow chart demonstrating a method 400 of extinguishing an arc fault 30 of a wire bond 22, as described herein. The method 400 begins by activating a gas-generating fuel 24, 124, 224 disposed on a substrate 12, 212, wherein the activation of the gas-generating fuel 24, 124, 224 generates a jet of gas 36, 136, 236 toward the wire bond 22 configured to disrupt the arc fault 30, at 410. Aspects of the disclosure can be included wherein, for instance, the method 400 also includes sensing, by a controller module 270 or a processor 272, the presence of an arc fault 30 of the wire bond 22, and in response to the sensing, controllably activating the gas-generating fuel 24, 124, 224. In another non-limiting aspect of the disclosure, the activating the gas-generating fuel 24, 124, 224 at 410 can include generating a jet of gas 36, 136, 236 configured to extinguish the arc fault 30 by blasting arc fault plasma away from the wire bond. In another non-limiting aspect of the disclosure, a further step can include detecting or determining a fault is occurring or has occurred, and then, or in response to the fault, activating the gas-generating fuel 24, 124, 224.

The sequences depicted are for illustrative purposes only and are not meant to limit the methods 300, 400 in any way as it is understood that the portions of the methods can proceed in a different logical order, additional or intervening portions can be included, or described portions of the methods can be divided into multiple portions, or described portions of the method can be omitted without detracting from the described methods.

Many other possible embodiments, aspects, and configurations in addition to that shown in the above figures are contemplated by the present disclosure. For example, it is envisioned that aspects of the invention can be included at multiple points of a power distribution system or at multiple wire bond connections. The thresholds described herein can be estimated, arbitrarily set, determined empirically, or be defined with reference to an existing value (e.g. 2 volts above or below the expected voltage values). Additionally, the design and placement of the various components can be rearranged such that a number of different in-line configurations could be realized. For instance, while the sealing cover 26 is only illustrated in FIG. 1, aspects of the sealing cover 26 can be included in any of the configurations described herein. Likewise, while the controller module 270 is only illustrated in FIG. 4, aspects of the controller module 270 can be included in any of the configurations described herein. Furthermore, aspects of the gas-generating fuel 24, 124, 224 can be included or disposed on a printed circuit board 10, 110, 210, or another location to disrupt or extinguish an arc fault or failure event, such as the failure of a solid state device, as opposed to a wire bond 22. In another aspect, the gas-generating fuel 24, 124, 224 can be exchange or replaced by a gas stored under pressure in a sealed container, and disposed on the substrate 12, 212. In this sense, the sealed container can be ruptured, for example, by melting from heat of the arc fault 30, or by a controllable signal from a controller module 270, releasing the gas to disrupt or extinguish the arc fault 30.

The aspects disclosed herein provide an apparatus and method for disrupting or extinguishing arc faults on a wire bond of a printed circuit board. The technical effect is that the above described aspects enable the detecting, confirming, disrupting, or extinguishing of electrical faults or arc faults in a circuit. Aspects of the disclosure enable or provide for disrupting or extinguishing arc faults by way of a self-activating or self-contained process. In this sense, aspects of the disclosure can be included wherein the arcing event, itself, is the activating event for extinguishing the arc fault. In this sense, the system can be configured to be actively activated (e.g. with the controller module 270) or passively activated (e.g. by way of heat from the arc fault 30). The above described embodiments, thus, provide for increased safety for an electrical network or power distribution system by disrupting or extinguishing arc fault events, and hence improve the overall safety of the electrical network. In yet another advantage, the passive nature of aspects of the above described configurations provide for electrical fault protection and fault disruption or extinguishing at early fault stages or states, possibly even prior to an observer noticing said fault.

To the extent not already described, the different features and structures of the various aspects can be used in combination with each other as desired. That one feature cannot be illustrated in all of the aspects is not meant to be construed that it cannot be, but is done for brevity of description. Thus, the various features of the different aspects can be mixed and matched as desired to form new embodiments, whether or not the new embodiments are expressly described. Combinations or permutations of features described herein are covered by this disclosure.

This written description uses examples to disclose embodiments of the invention, including the best mode, and also to enable any person skilled in the art to practice embodiments of the invention, including making and using any devices or systems and performing any incorporated methods. The patentable scope of the invention is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A printed circuit board comprising:
a substrate;
an electrical component disposed on the substrate;
a wire bond connected with the electrical component; and
a gas-generating fuel disposed on the substrate proximate to the wire bond and operably activatable by a control signal indicative of an arc fault of the wire bond, such that activation of the gas-generating fuel generates a jet of gas toward the wire bond.

2. The printed circuit board of claim 1 wherein the gas-generating fuel is configured such that the jet of gas operably disrupts an arc fault of the wire bond.

3. The printed circuit board of claim 1 wherein the gas-generating fuel is configured such that the jet of gas operably extinguishes an arc fault of the wire bond.

4. The printed circuit board of claim 1 wherein the gas-generating fuel includes an oxidizer.

5. The printed circuit board of claim 1 wherein the gas-generating fuel includes a nitrogen-rich fuel.

6. The printed circuit board of claim 1 wherein the gas-generating fuel is configured to generate an inert jet of gas.

7. The printed circuit board of claim 1 wherein the gas-generating fuel is operably activatable in response to heat.

8. The printed circuit board of claim 7 wherein the gas-generating fuel is operably activatable in response to heat generated by an arc fault of the wire bond.

9. The printed circuit board of claim 1 further including a casing disposed on the substrate and having at least one side wall and wherein the gas-generating fuel is disposed in the casing.

10. The printed circuit board of claim 9 wherein the at least one side wall is configured to direct the jet of gas toward the wire bond.

11. The printed circuit board of claim 1 wherein the substrate includes a depression and wherein the gas-generating fuel is disposed in the depression.

12. The printed circuit board of claim 11 wherein the substrate defines at least one side wall of the depression, and wherein the at least one side wall is configured to direct the jet of gas toward the wire bond.

13. The printed circuit board of claim 1 further including a sealing cover over the gas-generating fuel.

14. A method of assembling a printed circuit board, comprising:
disposing a gas-generating fuel on the substrate proximate to at least one wire bond, wherein the gas-generating fuel is operably activatable by a control signal indicative of an arc fault of the at least one wire bond, such that activation of the gas-generating fuel generates a jet of gas toward the at least one wire bond.

15. The method of claim 14, further comprising providing a wire bond connection configuration for a substrate for disposing at least one wire bond to connect an electrical input to an electrical output, wherein the disposing locates the at least one wire bond proximate to the gas-generating fuel.

16. The method of claim 14 wherein the disposing the gas-generating fuel further includes disposing the gas-generating fuel on the substrate intersecting the at least one wire bond.

17. A method of extinguishing an arc fault of a wire bond, comprising:
activating, by a control signal indicative of an arc fault of the wire bond, a gas-generating fuel disposed on a substrate, wherein the activation of the gas-generating fuel generates a jet of gas toward the wire bond configured to disrupt the arc fault.

18. The method of claim 17, further comprising sensing, by a controller module, the presence of an arc fault of the wire bond, and in response to the sensing, controllably activating the gas-generating fuel.

19. The method of claim 17, wherein the activating the gas-generating fuel includes generating a jet of gas configured to extinguish the arc fault by blasting arc fault plasma away from the wire bond.

* * * * *